(12) United States Patent
Chang et al.

(10) Patent No.: US 7,926,017 B2
(45) Date of Patent: Apr. 12, 2011

(54) LAYOUT METHOD FOR A CHIP

(75) Inventors: Chung-Chiao Chang, Taipei (TW); Jian-Liang Chen, Taipei (TW)

(73) Assignee: Ali Corporation, Taipei (TW)

( * ) Notice: Subject to any disclaimer, the term of this patent is extended or adjusted under 35 U.S.C. 154(b) by 260 days.

(21) Appl. No.: 12/351,213

(22) Filed: Jan. 9, 2009

(65) Prior Publication Data

US 2010/0050140 A1  Feb. 25, 2010

(30) Foreign Application Priority Data

Aug. 25, 2008 (CN) .......................... 2008 1 0212621

(51) Int. Cl.
*G06F 17/50* (2006.01)
(52) U.S. Cl. ........ 716/122; 716/113; 716/123; 716/126; 716/136
(58) Field of Classification Search .................. 716/6, 9, 716/10, 13, 14, 113, 122, 123, 126, 136
See application file for complete search history.

(56) References Cited

U.S. PATENT DOCUMENTS

| | | |
|---|---|---|
| 5,847,965 A | 12/1998 | Cheng |
| 6,324,678 B1 * | 11/2001 | Dangelo et al. ............... 716/103 |
| 7,107,568 B2 * | 9/2006 | Cronquist ..................... 716/103 |

\* cited by examiner

*Primary Examiner* — Phallaka Kik
(74) *Attorney, Agent, or Firm* — Thomas|Kayden (57) ABSTRACT

A layout method is provided, adaptable to place cell on a chip. Firstly, a chip area is assigned for a floor plan. A global reservation deployment process is then performed to define a plurality of room units to be uniformly distributed on the chip area. Cells are placed on the chip based on the floor plan. The chip area is categorized into at least a high frequency region and a low frequency region according to operation frequencies of the placed cells thereon. A frequency based reservation deployment process is then performed to move one or more room units distributed in the low frequency region toward the high frequency region. A local cell replacement process, a routing and timing analysis are performed. If hotspots are induced, room units around the hotspots are redistributed, and then the steps of local cell replacement, routing and timing analysis are repeated.

13 Claims, 9 Drawing Sheets

LAYOUT METHOD FOR A CHIP

CROSS REFERENCE TO RELATED APPLICATIONS

This Application claims priority of China Patent Application No. 200810212621.0, filed on Aug. 25, 2008 the entirety of which is incorporated by reference herein.

BACKGROUND OF THE INVENTION

1. Field of the Invention

The invention relates to integrated circuit design, and in particular, to a layout method for standard cell placement on a system on chip.

2. Description of the Related Art

A system on chip (SOC) comprises thousands or millions of standard cells (also referred to as "cells"), such as logic units, AND gates, OR gates, and registers. Hence, an Electronic Design Automation (EDA) tool is required to help design an SOC. Conventionally, a floor plan (FLOOR PLAN) is performed to deposit analog modules, memory modules and IO pads on particular locations on the SOC. Other cells are then placed (PLACEMENT) on appropriate locations, and thereafter, a routing process (ROUTING) is performed.

Figure 1A:
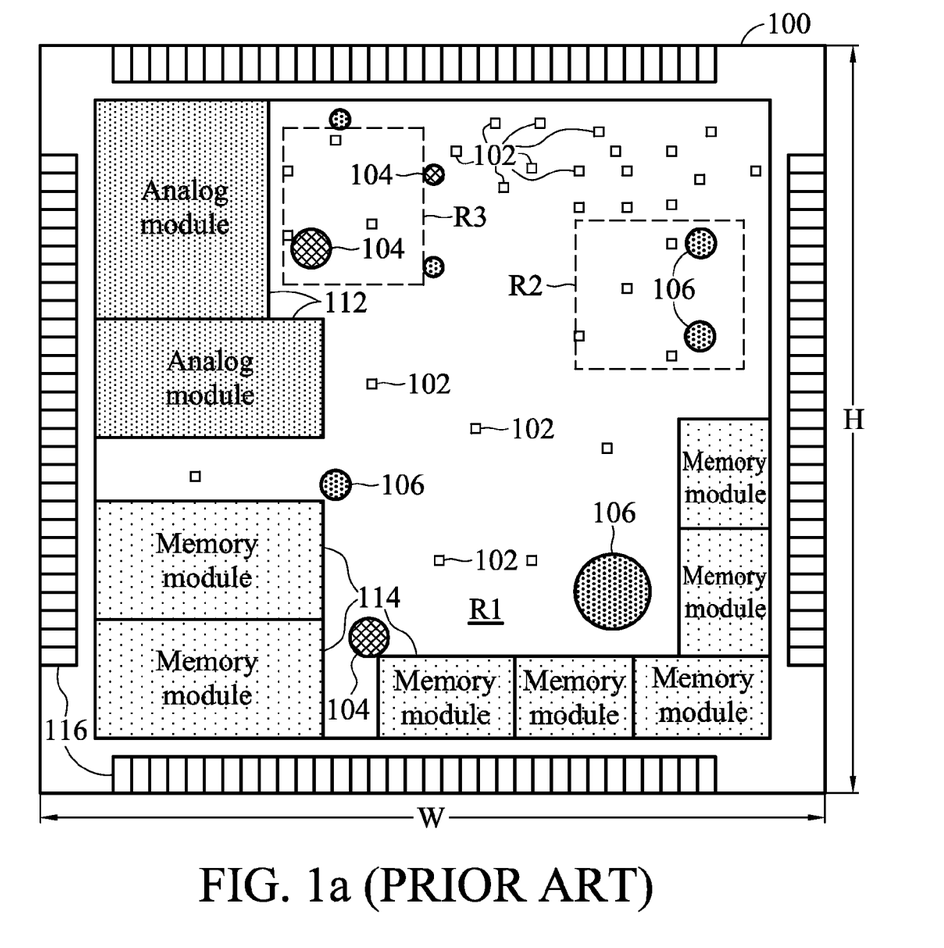
FIG. 1a shows a layout on a conventional SOC 100.

FIG. 1a shows a conventional SOC 100. The SOC 100 has a height H and a width W, in which specific areas are already occupied by an analog module 112, a memory module 114 and IO pads 116. The placement of cells contains three types. The first type is a direct placement. The EDA tool directly places cells on standard cell region based on its operation frequency and connectivity relationships. For example, the R1 region in FIG. 1a is exactly the standard cell region that excludes the analog module 112 and the memory module 114. The second type is a specific reservation placement, whereby a particular region is reserved for a particular module according to user requirements, such as the R2 region in the SOC 100. The third type is an unspecific reservation placement. Area utilization rate of a particular region is regulated, but placement of cells is not constrained, such as the R3 region in the SOC 100.

When all cells are placed on the SOC 100, a routing and timing analysis is performed. The regions where routing resource are not enough, or where operation frequencies fail to meet a timing criterion, are marked as a light hotspot 104 or a heavy hotspot 106. If a region is not fully utilized, a plurality of free space 102 would be formed. A hotspot comprises two types based on its cause. One is a routing hotspot, wherein routing resource is not enough to accomplish wire connection between components. Another is a timing hotspot, wherein operation frequencies in the region cannot meet the timing criterion.

Figure 1B:
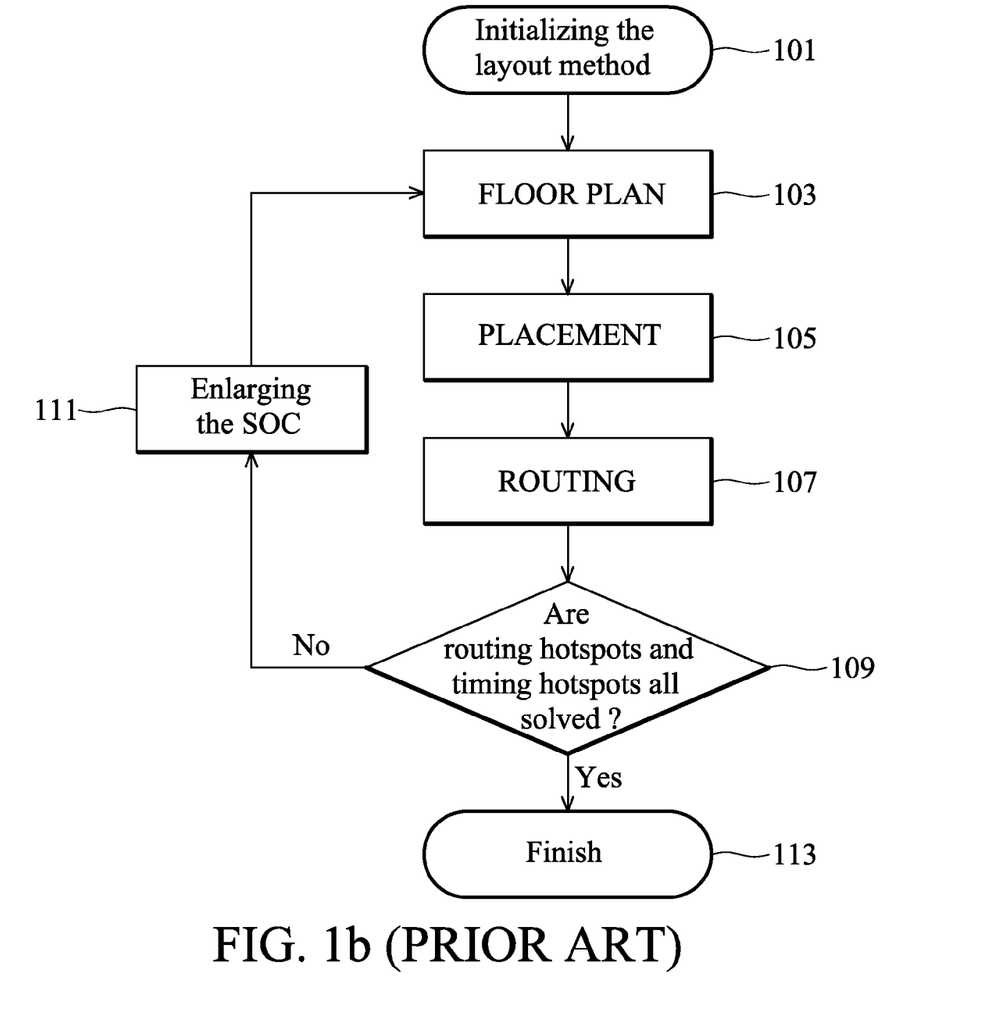
FIG. 1b is a flowchart of a conventional layout method.

Hotspots always occur, and conventionally, chip area is recursively adjusted until all criteria for routing wires and operation frequencies are met. FIG. 1b is a flowchart of a conventional layout method. In step 101, the layout method is initialized. In step 103, a floor plan is performed on an SOC 100 with height H and width W. In step 105, the EDA tool performs a placement process based on the floor plan result to place cells of various types R1, R2 or R3 on the SOC 100. In step 107, the EDA tool performs a routing process on the SOC 100. In step 109, it is examined whether routing hotspots and timing hotspots have been mitigated. If any hotspot exists, step 111 is processed to increase the height H and width W of the SOC 100, and step 103 is repeated for a new floor plan. If all hotspots are mitigated, step 113 the layout method is concluded.

In practice, chip area is a limited resource, and mitigating the hotspots by enlarging chip area could induce considerable costs. Additionally, area utilization rate of non-hotspot areas are decreased when chip area is increased. Thus, the conventional approach is cost ineffective and produces less competitive products. Therefore an enhancement is desirable.

BRIEF SUMMARY OF THE INVENTION

An exemplary embodiment of a layout method is provided, adaptable to place cells on a chip. Firstly, a chip area is assigned for a floor plan. A global reservation deployment process is then performed to define a plurality of room units to be uniformly distributed on the chip area. Cells are placed on the chip based on the floor plan. The chip area is categorized into at least a high frequency region and a low frequency region according to operation frequencies of the cells placed thereon. A frequency based reservation deployment process is then performed to move one or more room units distributed in the low frequency region toward the high frequency region. A local cell replacement process is performed for the placed cells based on the distribution of the room units to decrease possibility of hotspots. A routing and timing analysis is performed to determine whether hotspots are induced from the cells placement. If hotspots are induced, room units around the hotspots are redistributed, and then the steps of local cell replacement, routing and timing analysis are repeated.

Furthermore, number of repetitions of the routing and timing analysis is calculated. If the number of repetitions exceeds a predetermined number, the chip area is enlarged, and the step of performing a floor plan is repeated.

When performing the global reservation deployment process, a total of cells areas are multiplied by a reservation deployment ratio to obtain a total reservation deployment area. A plurality of room units, each having a fixed row height, is provided, such that the sum of the area are equivalent to the total reservation deployment area. In the embodiment, the fixed row height is exactly identical to the cells' row height. The room units and cells are then aligned by rows while the room units are uniformly distributed on the chip. The reservation deployment ratio ranges between 2% to 4%.

When performing the frequency based reservation deployment process, operation frequencies of all cells are ranked by a percentile rank. A region where operation frequency ranking is lower than a first level is assessed as the low frequency region. Conversely, a region where operation frequency ranking is higher than a second level is assessed as the high frequency region.

When performing the frequency based reservation deployment process, a first area sum of the room units in the low frequency region, and a second area sum of the room units in the high frequency region, are calculated. One or more room units are moved from the low frequency region toward the high frequency region based on the following formula:

$$\min(L_{RS}, H_{RS}) \times r\% < H_S$$

Where $L_{RS}$ is the first area sum of reserved space, $H_{RS}$ is the second area sum of reserved space, $H_S$ is residual available area within the high frequency region excluding $H_{RS}$, and r is a customized parameter.

When performing the routing and timing analysis, it is determined whether a routing resource is sufficient. A region where the resource for routing is insufficient is assessed as a routing hotspot. When redistributing room units around the hotspots, if the hotspot is a routing hotspot, one or more room units are moved from a rich routing resource region to the hotspot based on the following formula:

$$\frac{\text{Pin}(BBOX)}{\text{Area}(BBOX) + (A_{RSi} \times q\%)} < R_{routable},$$

Where BBOX is a rectangle just covering the hotspot, Pin(BBOX) is a pin number within the coverage of the rectangle, Area(BBOX) is the area of the rectangle, $A_{RSi}$ is the area sum of room units within the hotspot, q is a borrowing ratio, and $R_{routable}$ is the maximum allowable pin density.

When performing the routing and timing analysis, a design rule is examined to determine whether a route meets a timing criterion or a frequency criterion, and a region that does not meet the timing or frequency criterion is assessed as a timing hotspot. When redistributing room units around the hotspots, if the hotspot is a timing hotspot, room units within the hotspot are released to become available resources for cells placement, and one or more room units are moved from the low frequency region toward the timing hotspot.

After redistributing room units around the hotspots, cells placed around the hotspot are rearranged, and the step of routing and timing analysis is repeated thereafter. In a further embodiment, after redistributing room units around the hotspots, one or more room units are released to become available resources for placement of voltage stabilization cells.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 3b shows an embodiment of a region 310 according to FIG. 3a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
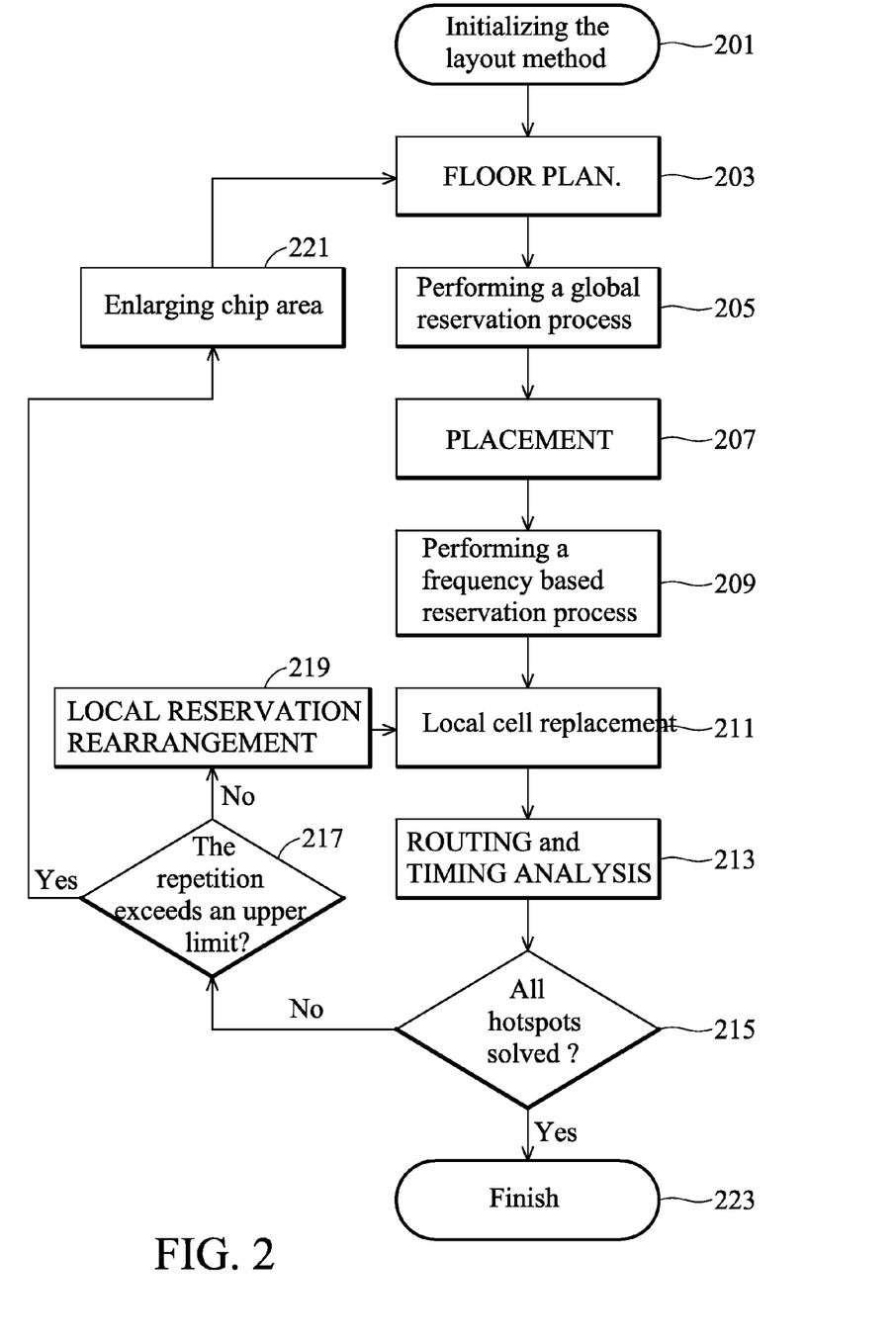
FIG. 2 is a flowchart of a layout method according to an embodiment of the invention.

FIG. 2 is a flowchart of a layout method according to an embodiment of the invention. In the invention, an approach for reserving areas is proposed. The reservation deployment is achieved by packaging reserved space into standard cell styles, hereby referred to as room units. Operation frequencies of cells are taken as a basis for distributing the room units, thereby increasing efficiency of a successive routing process, as well as area utilization rate. In step 201, the layout method is initialized. In step 203, a floor plan is performed on the substrate of the SOC, whereby design rules and fundamental structure are defined. The floor plan is a known prior art provided by an EDA tool, thus detailed description is omitted herein. In step 205, a global reservation deployment process is performed on the SOC. Reserved spaces are packaged into room units to be processed like standard cells. The room units are uniformly distributed on the substrate of the SOC. In step 207, a placement process is performed on the substrate of the SOC. As described, the placement process comprises three types, R1, R2 and R3. Generally, operation frequencies of each cell are different. After the placement, the areas on the SOC could be categorized into a plurality of different regions based on the operation frequencies, such as a high frequency region and a low frequency region. More specifically, operation frequencies of the cells can be ranked as a percentile rank, wherein the coverage of cells in the lowest $P_L\%$ is assessed as the low frequency region. Likewise, the coverage of cells in the highest $P_H\%$, is assessed as the high frequency region. In the embodiment, the range of $P_L\%$ and $P_H\%$ are preferably between 15% and 25%. In step 209, a frequency based reservation deployment process is performed to move one or more room units distributed in the low frequency region toward the high frequency region. Generally, the area utilization rate in the low frequency region is not high, but that of the high frequency region is always too high. Thus, the frequency based reservation deployment process can balance the area utilization rate of each region. In step 211, a local cell replacement process is performed to decrease possibility of hotspots. In step 213, a routing and timing analysis is performed to determine whether hotspots are induced from the cell placement. In step 215, a result of the routing and timing analysis is examined. If both routing hotspots and timing hotspots are mitigated, step 223 the layout method is concluded. Otherwise, if any hotspot exists, step 217 is processed. In step 217, number of repetitions of the routing and timing analysis is calculated. An upper limit for the number of repetitions is defined to constrain the times of local cell replacement. As an example, considering cost and convergence time, the upper limit can be a number lower than 10. But if cost and convergence time are irrelevant, the upper limit is not limited to be lower than 10. If the number of repetitions does not exceed the upper limit, a local reservation rearrangement is performed in step 219, and then the process loops back to step 211. If the number of repetitions in step 217 exceeds the upper limit, step 221 is processed, whereby the chip area is increased. Thereafter, the process loops back to step 203, and a new floor plan is performed. The deployment of reserved room unit allows a more efficient number of recursive loops and decreases the probability to enlarge the SOC size.

Figure 3A:
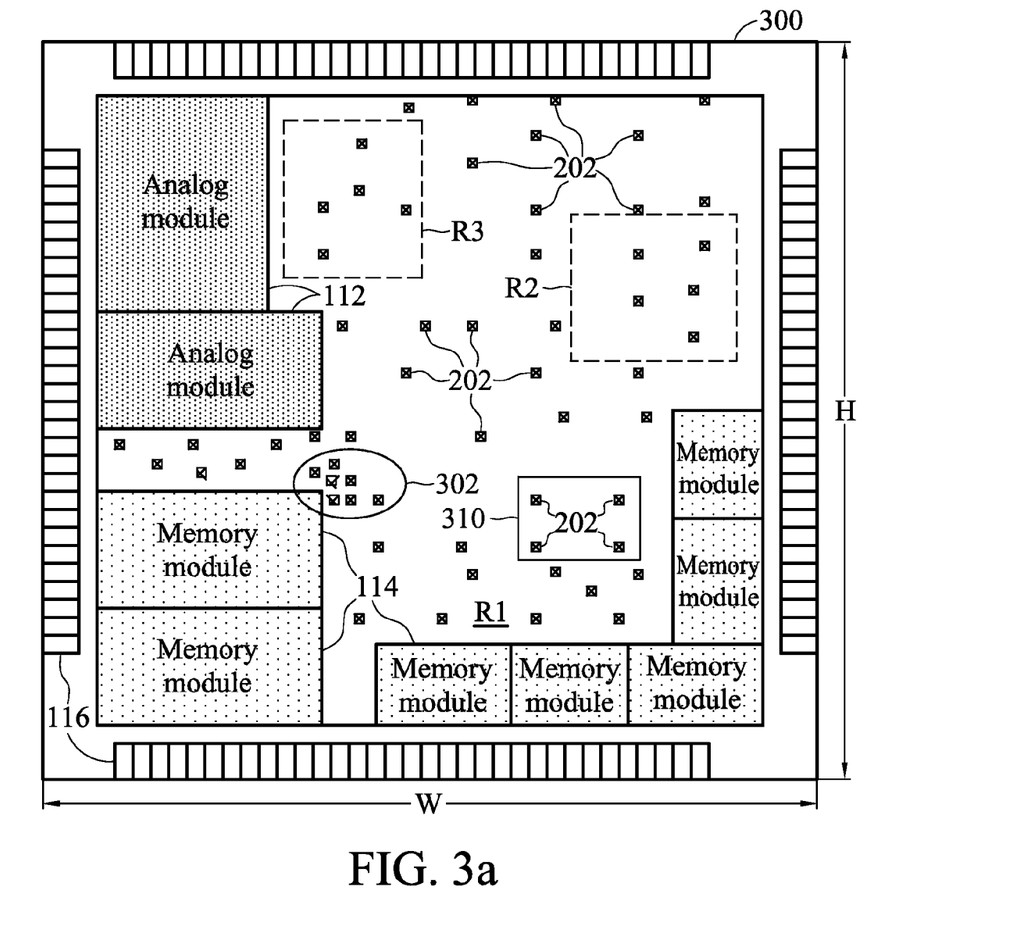
FIG. 3a shows an embodiment of an SOC 300 according to the invention.

FIG. 3a shows an embodiment of an SOC 300 according to the invention. The total area of the SOC 300 is determined by its height H and width W. When performing the floor plan, fundamental structures of the analog module 112, memory module 114 and IO pads 116 are decided. Thereafter, a global reservation deployment process distributes a plurality of room units 202 on the SOC 300. The basic principle is to distribute the room units 202 uniformly, however, some special regions where hotspots tend to occur such as cross corners 302, can be allocated with more room units 202. When performing cell placement, the EDA tool would recognize the room units 202 as real cells, so the areas occupied thereby would not be used to place other cells. In this way, flexibility of area arrangement in the successive steps is increased. In the embodiment, assume that the total area of the cells is $A_{STD}$, and p % thereof is spared area, then the total area of room units $A_{RS}$ can be expressed as:

$$A_{STD} \times \frac{p}{100} = A_{RS}. \tag{1}$$

The value p can be flexibly selected based on experimental trials of the EDA tool, generally between 2 to 4, such as 3. Alternatively, p can be manually decided based on a designer's experience.

Figure 3B:
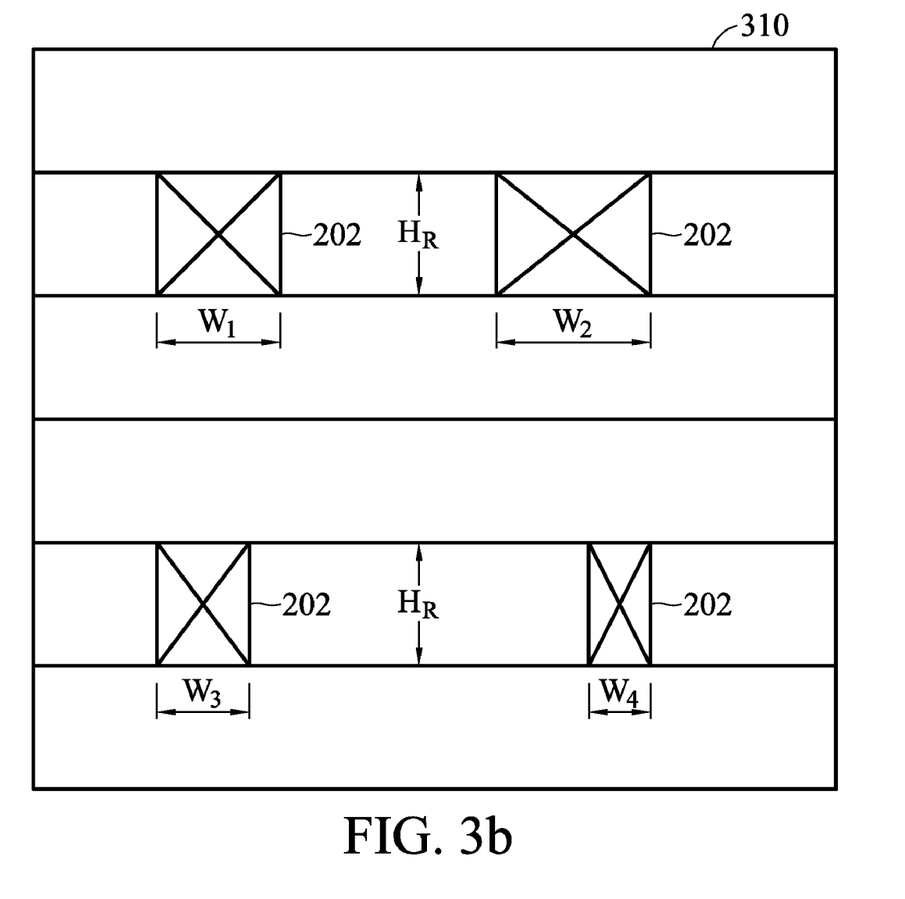

FIG. 3b shows an embodiment of a region 310 according to FIG. 3a. A standard cell typically comprises predefined characteristics, such as a fixed row height. The SOC 300 is actually divided into a plurality of rows, and all the standard cells are placed with alignment by rows. The room units 202 are designated to resemble the standard cells. For example, a room unit 202 in the region 310 has the same row height $H_R$ as the standard cell. Nevertheless, the widths of the room units 202 can be variable, such as W1, W2, W3 and W4. The area sum of the room units 202 is the $A_{RS}$ of equation (1).

Figure 4A:
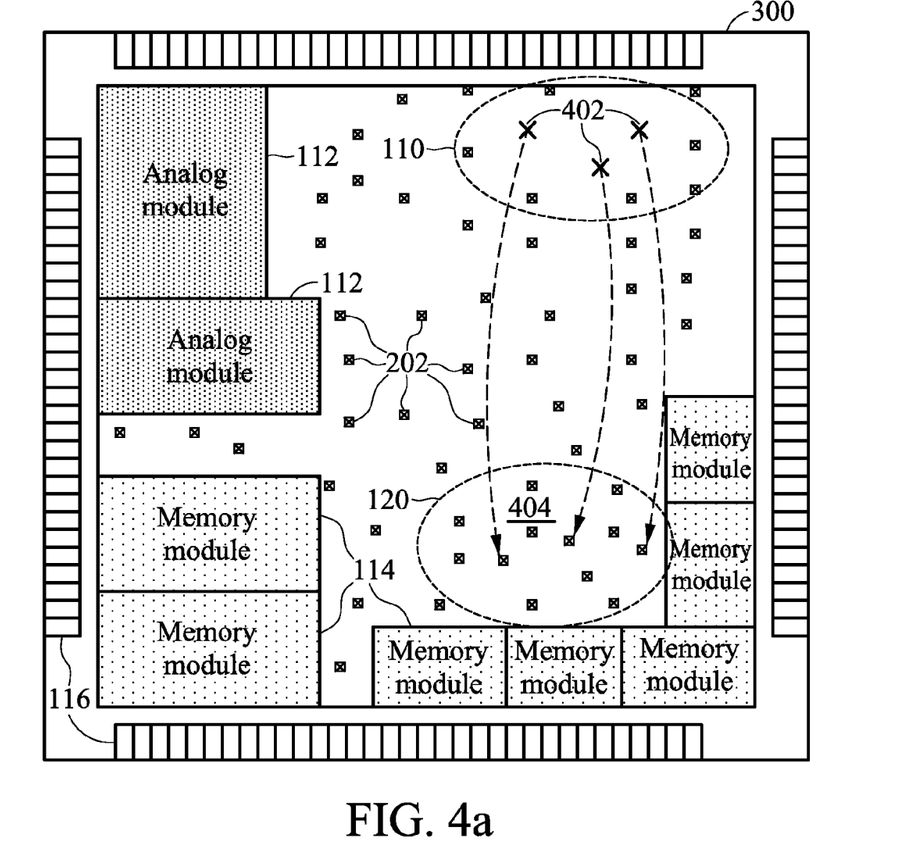
FIG. 4a shows an embodiment of a frequency based space reservation deployment method.

FIG. 4a shows an embodiment of a frequency based space reservation deployment method in step 209. After the cells are placed in step 207, one or more low frequency regions 110 and high frequency regions 120 may be formed on the SOC 300 according to operation frequencies of their adjacent cells. As described, a low frequency region 110 may have low area utilization rate, while a high frequency region 120 always suffers from a too high area utilization rate. On the other hand, a high frequency region 120 usually requires more voltage stabilization units to maintain stability of power supply. Therefore, one or more room units 202 within the low frequency region 110 are moved to the high frequency region 120 in step 209. In other words, some of the room units 402 in the low frequency region 110 are deleted, while the same plurality of room units 404 are added to the high frequency region 120.

Figure 4B:
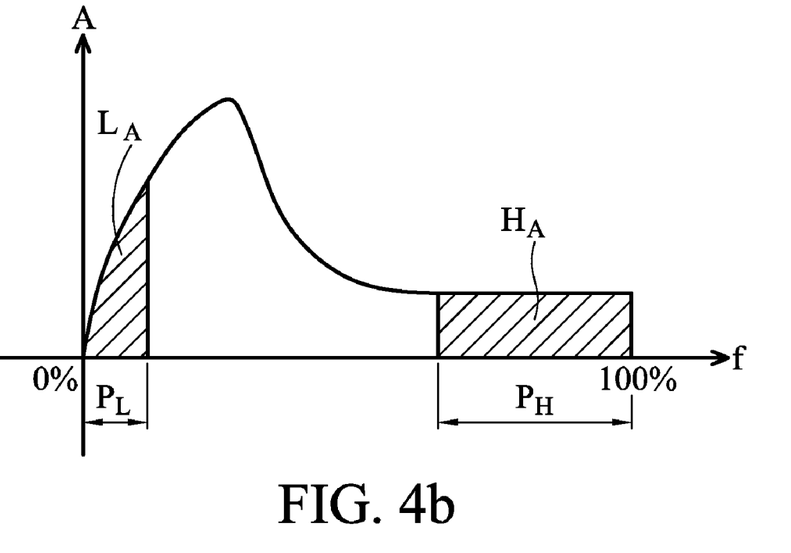
FIGS. 4b and 4c are percentage charts of operation frequencies.

FIGS. 4b is a percentage chart of operation frequencies within the SOC. The horizontal axis indicates operation frequency in percentile rank, ranging from 0% to 100%. The vertical axis represents area sum of cells per operation frequency. It is shown that the coverage of cells within the lowest $P_L$ % is assessed as the low frequency region $L_A$. Likewise, the coverage of cells within the highest $P_H$ % is assessed as the high frequency region $H_A$. The values $P_L$ and $P_H$ can be flexibly adjusted based on the areas $L_A$ and $H_A$. In the case shown in FIG. 4b, $P_H$ is set to higher than $P_L$, making the $L_A$ subsequently identical to $H_A$. In this way, the successive frequency based reservation deployment process would more reasonably move the room units.

Figure 4C:
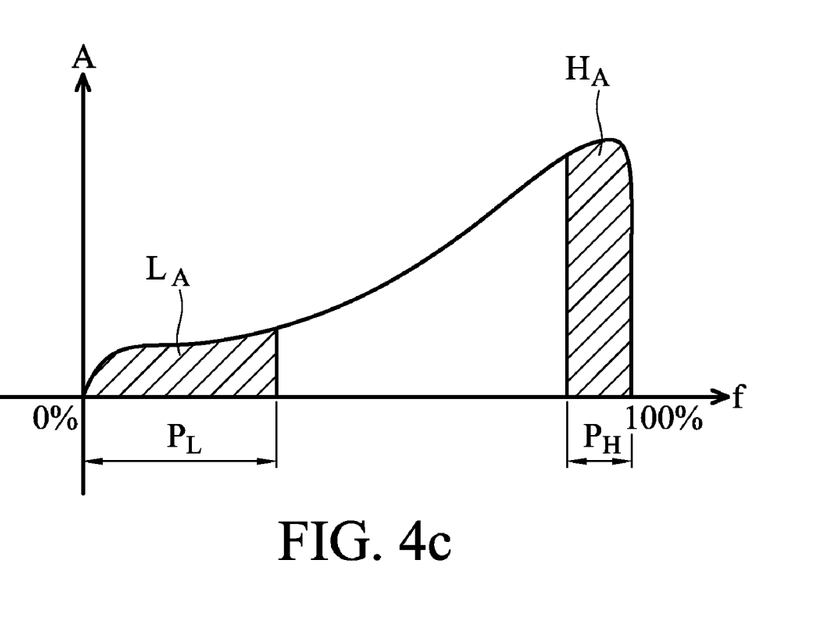

FIG. 4c shows another embodiment of a percentage chart, in which the high frequency cells outnumber the low frequency cells. Thus, the value $P_L$ is set to larger than $P_H$, allowing the $L_A$ and $H_A$ to be subsequently equal. When performing the frequency based reservation deployment process, the following formula is used to determine the number of room units 202 to be moved:

$$\min(L_{RS}, H_{RS}) \times r\% < H_S,$$

Where $L_{RS}$ is the area sum of room unit 202 in the low frequency region 110, $H_{RS}$ is the area sum of room units 202 in the high frequency region 120, $H_S$ is residual available area within the high frequency region excluding $H_{RS}$, and r is a customized parameter.

Figure 5:
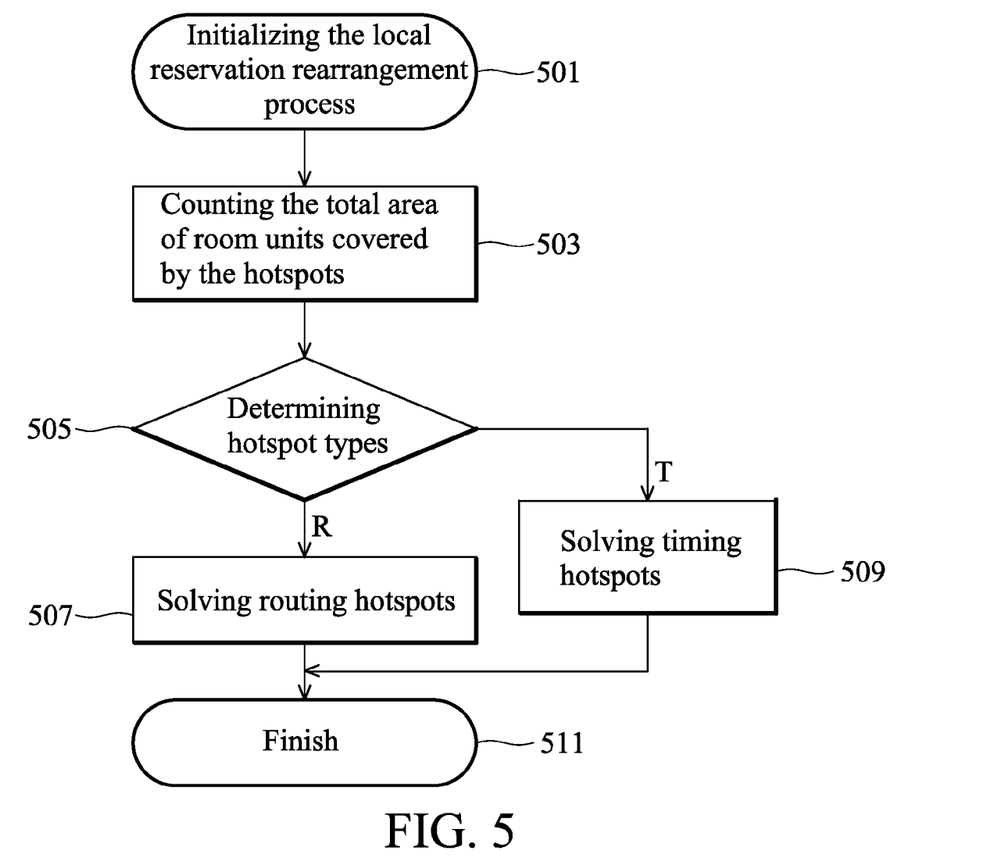
FIG. 5 shows a further embodiment of step 219 in FIG. 2.

FIG. 5 shows a further embodiment of step 219 in FIG. 2. Step 219 is dedicated to rearrange local room units to resolve hotspots. In step 501, the local reservation rearrangement process is initialized. In step 503, the total area of room units covered by the hotspots are calculated, where $A_{RSi}$ represents the area of room units covered by an $i^{th}$ hotspot. In step 505, hotspots are mitigated by different measures depending on their types. For example, routing hotspots are mitigated in step 507 (arrow R), and timing hotspots are mitigated in step 509 (arrow T).

In step 507, when mitigating a routing hotspot, one or more room units deposited in another rich routing resource region are selected and moved to the hotspot. Specifically, the formula expresses the condition as follows:

$$\frac{Pin(BBOX)}{Area(BBOX) + (A_{RSi} \times q\%)} < R_{routable}, \quad (2)$$

Where BBOX is a rectangle just covering the hotspot, Pin(BBOX) is a pin number within the coverage of the rectangle, Area(BBOX) is the area of the rectangle, $A_{RSi}$ is the area sum of room units within the hotspot, q is a borrowing ratio, and $R_{routable}$ is the maximum allowable pin density. In the formula (2), the q % borrowing ratio keeps the pin density from exceeding the maximum allowable value $R_{routable}$, thereby not allowing the routing hotspot to occur. The room units 202 that are moved, are not further rearranged.

Timing hotspots are mitigated in step 509, in which, original room units are released as available resources, and additional room units are provided from another region. Since the original room units deposited in the hotspots are released, their occupied spaces become available resources for the EDA tool to fix the hotspot. However, as room units are releasing, the probability of voltage stabilization insertion are also decreasing. If too many room units were released, there would be insufficient resources for voltage stabilization insertion. Thus, one or more room units 202 would be further moved from a low frequency region 110 to the hotspot. When steps 507 and 509 are finished, in step 511, the rearrangement of local room units is concluded. Thereafter, step 211 follows step 219, wherein a local cell replacement process is performed.

Figure 6A:
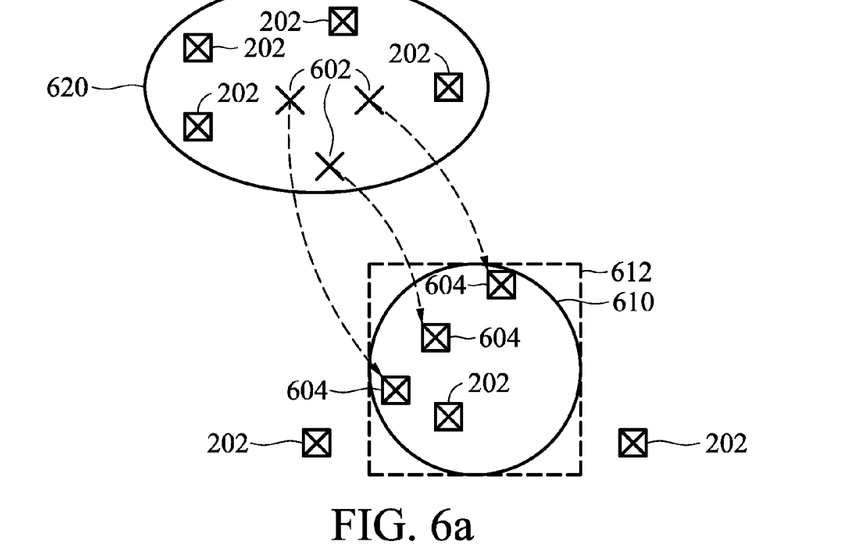
FIG. 6a shows an embodiment of elimination of a routing hotspot.

FIG. 6a shows an embodiment of routing hotspot solution in step 507. A routing hotspot 610 is shown. A rectangle 612 has just sufficient size to cover the routing hotspot 610, in which a plurality of room units 202 is deposited. To solve the routing hotspot 610, one or more room units 202 are borrowed from the rich routing resource region 620. In other words, some of the room units 602 in the rich routing resource region 620 are deleted, whereas the same amount of room units 604 are inserted in the rectangle 612.

Figure 6B:
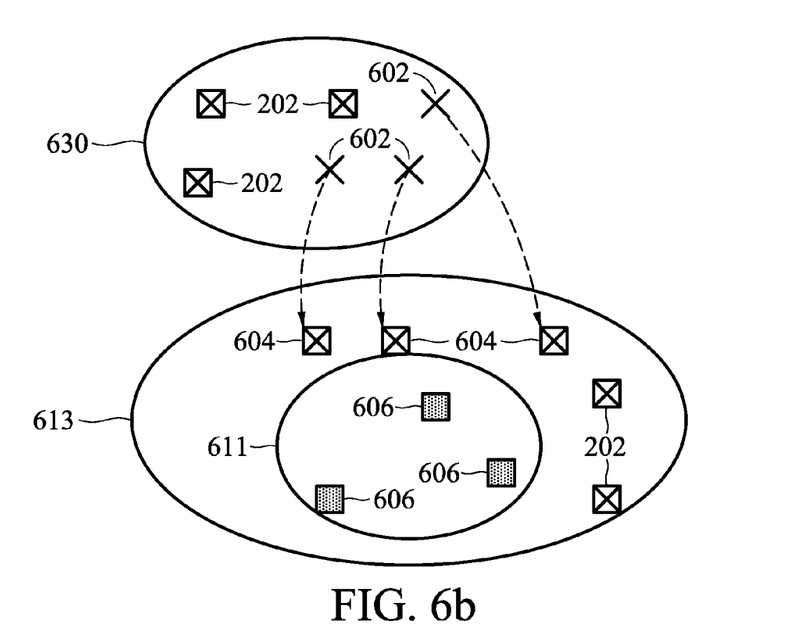
FIG. 6b shows an embodiment of elimination of a timing hotspot.

FIG. 6b shows an embodiment of mitigating a timing hotspot in step 509. A timing hotspot 611 is shown, with a frequency region 613 where the timing hotspot 611 occurs, and a plurality of room units 202. Some of the room units 202 are released to be free space 606, available for use by the EDA tool. However, in order to maintain voltage stabilization, one or more room units 202 are borrowed from the low frequency region 630. In other words, a particular number of room units 602 is deleted from the low frequency region 630, and the same number of room units 604 are added in the frequency region 613.

In the embodiment, the room unit 202 has a fixed row height, but a variable width, hence the total reservation deployment area can be accurately controlled. The number of room unit 202 is not fixed, to facilitate the flexibility of space arrangement. The room units 202 are basically uniformly distributed in global area, but for particular local areas such as narrow tunnel areas, corners or timing is critical regions, it may be distributed more densely, such that hotspots can be decreased. The reservation deployment approach proposed in the invention can be implemented on various platforms with various layout tools without limitation. When the local cell replacement in step 211 is processed, it may be necessary to size-up existing standard cells or to insert additional cells (such as buffers), wherein the operations require extra spaces. The room unit 202 of the invention can fully satisfy such requirements, significantly decreasing the possibility to move the placed standard cells, and speed up the recursive fixing loop for timing closure. Compared to the conventional method, the proposed layout method can increase up to 5% chip area utilization rate. Finally, when the layout process is finished, the unused room units 202 are used to deposit voltage stabilization units, such that power supply reliability of the high frequency region 120 can be increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A layout method for a chip, adaptable to place cells on the chip, comprising:
    assigning a chip area for a floor plan;
    performing a global reservation deployment process to define a plurality of room units to be uniformly distributed on the chip area;
    placing cells on the chip based on the floor plan;
    categorizing the chip area into at least a high frequency region and a low frequency region according to operation frequencies of the cells;
    performing by a computer a frequency based reservation deployment process to move one or more room units distributed in the low frequency region toward the high frequency region;
    performing a local cell replacement for the placed cells based on a distribution of the room units to decrease possibility of hotspots;
    performing a routing and timing analysis to determine whether hotspots are induced from the cell placement; and
    if hotspots are induced, redistributing room units around the hotspots, and returning to the step of local cell replacement, routing and timing analysis.

2. The layout method as claimed in claim 1, further comprising:
    counting number of repetitions of the routing and timing analysis; and
    if the number of repetitions exceeds a predetermined number, increasing the chip area and returning to the step of assigning a chip area for a floor plan.

3. The layout method as claimed in claim 1, wherein the global reservation deployment process comprises:
    multiplying a total of cells areas by a reservation deployment ratio to obtain a total reservation deployment area;
    providing a plurality of room units, each having a fixed row height, such that a sum of the areas are equivalent to a total reservation deployment area, wherein the fixed row height is equivalent to the rows' height; and
    aligning the room units and cells by rows while uniformly distributing the room units on the chip.

4. The layout method as claimed in claim 3, wherein the reservation deployment ratio ranges between 2% to 4%.

5. The layout method as claimed in claim 1, wherein the frequency Based reservation deployment process comprises:
    ranking operation frequencies of all cells by a percentile rank;
    assessing a region as the low frequency region, wherein operation frequency ranking is lower than a first level; and
    assessing a region as the high frequency region, wherein operation frequency ranking is higher than a second level.

6. The layout method as claimed in claim 5, wherein the frequency based reservation deployment process further comprises:
    counting a first area sum of the room units in the low frequency region, and a second area sum of the room units in the high frequency region;
    moving one or more room units from the low frequency region toward the high frequency region based on the following formula:

$\min(L_{RS}, H_{RS}) \times r\% < H_S$, wherein $L_{RS}$ is the first area sum of reserved space, $H_{RS}$ is the second area sum of reserved space, $H_S$ is a residual available area within the high frequency region excluding $H_{RS}$, and r is a customized parameter.

7. The layout method as claimed in claim 1, wherein the routing and timing analysis comprises:
    determining whether a routing resource is sufficient, and assessing a region where the routing resource is insufficient as a routing hotspot.

8. The layout method as claimed in claim 7, wherein the step of Redistributing room units around the hotspots comprises:
    if the hotspot is a routing hotspot, moving one or more room units from a rich routing resource region to the hotspot.

9. The layout method as claimed in claim 8, wherein the step of moving one or more room units from the rich routing resource region to the hotspot, is based on the following formula:

$$\frac{\text{Pin}(BBOX)}{\text{Area}(BBOX) + (A_{RSi} \times q\%)} < R_{routable},$$

where BBOX is a rectangle just covering the hotspot, Pin (BBOX) is a pin number within a coverage of the rectangle, Area(BBOX) is an area of the rectangle, $A_{RSi}$ is a sum of the room unit areas within the hotspot, q is a borrowing ratio, and $R_{routable}$ is a maximum allowable pin density.

10. The layout method as claimed in claim 1, wherein the routing and timing analysis comprises:
    examining a design rule to determine whether a design meets a timing criterion or a frequency criterion; and
    assessing a region that does not meet the timing criterion or the frequency criterion as a timing hotspot.

11. The layout method as claimed in claim 10, wherein the step of redistributing room units around the hotspots comprises:
    if the hotspot is a timing hotspot, releasing room units within the hotspot to become available resources for cell placement, and moving one or more room units from the low frequency region toward the timing hotspot.

12. The layout method as claimed in claim 1, further comprising, after redistributing room units around the hotspots, replace cells that are placed around the hotspot, and then returning to the step of routing and timing analysis.

13. The layout method as claimed in claim 1, further comprising, after redistributing room units around the hotspots, releasing one or more room units to become available resources for deployment of voltage stabilization cells.

* * * * *